(12) United States Patent
Qiao et al.

(10) Patent No.: US 11,921,148 B2
(45) Date of Patent: Mar. 5, 2024

(54) METHOD AND DEVICE FOR MONITORING PARTIAL DISCHARGE

(71) Applicant: Delta Electronics (Shanghai) Co., Ltd., Shanghai (CN)

(72) Inventors: Lifeng Qiao, Shanghai (CN); Dehui Zhang, Shanghai (CN); Teng Liu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/816,728

(22) Filed: Aug. 2, 2022

(65) Prior Publication Data

US 2023/0041663 A1    Feb. 9, 2023

(30) Foreign Application Priority Data

Aug. 3, 2021   (CN) .......................... 202110885027.3

(51) Int. Cl.
  *G01R 31/12* (2020.01)
  *G01R 19/00* (2006.01)
  (Continued)

(52) U.S. Cl.
  CPC ..... *G01R 31/1272* (2013.01); *G01R 19/0092* (2013.01); *G01R 31/20* (2013.01); *G01R 31/62* (2020.01)

(58) Field of Classification Search
  CPC ............ G01R 31/1272; G01R 19/0092; G01R 31/20; G01R 31/62; G01R 31/14; G01R 31/40; G01R 31/64
  (Continued)

(56) References Cited

U.S. PATENT DOCUMENTS 9,733,281 B2 * 8/2017 Kshirsagar ......... G01R 19/0053
10,598,733 B2 * 3/2020 Giussani ................ G01R 31/42
(Continued)

FOREIGN PATENT DOCUMENTS

CN    103913681 A    7/2014
CN    102890227 B    4/2015

OTHER PUBLICATIONS

CHEN Teng-biao et al., "Study on 110kV XLPE Cable Joint PD Detection Technology by Three-Pulse Signal Polarity Identification," Electric Wire & Cable, No. 1, Feb. 2014.

*Primary Examiner* — Giovanni Astacio-Oquendo
(74) *Attorney, Agent, or Firm* — CKC & Partners Co., LLC

(57) ABSTRACT

The disclosure discloses a method and device for monitoring partial discharge. The monitoring method including: step a, connecting a monitoring circuit in parallel to both ends of a tested product, disposing a ground wire between the monitoring circuit and ground, disposing a first sensor in the monitoring circuit, and disposing a ground wire sensor on the ground wire; step b, applying an excitation signal to the tested product, acquiring a first signal through the first sensor and acquiring a ground wire signal through the ground wire sensor within a monitoring cycle; and step c, determining whether the tested product has partial discharge through the first signal and the ground wire signal. The disclosure can avoid the partial discharge monitoring device from wrongly determining an interference signal to be a partial discharge signal, enhance anti-interference capability of the partial discharge monitoring device, and improve monitoring accuracy.

18 Claims, 8 Drawing Sheets

(51) Int. Cl.
  *G01R 31/20*   (2006.01)
  *G01R 31/62*   (2020.01)
(58) Field of Classification Search
  USPC .................................... 324/536, 512, 500
  See application file for complete search history.

(56) References Cited

U.S. PATENT DOCUMENTS

| | | | |
|---|---|---|---|
| 11,243,243 B2 * | 2/2022 | Han | ............... H02S 50/10 |
| 2021/0190849 A1 * | 6/2021 | Najafi | ............... G01R 31/62 |
| 2021/0373066 A1 * | 12/2021 | Sozer | ............. G01R 31/1245 |
| 2023/0258706 A1 * | 8/2023 | Negri | ............... G08B 29/06 |
| | | | 324/536 |

* cited by examiner

METHOD AND DEVICE FOR MONITORING PARTIAL DISCHARGE

CROSS-REFERENCE TO RELATED APPLICATIONS

This non-provisional application claims priority under 35 U.S.C. § 119(a) on Patent Application No. 202110885027.3 filed in P.R. China on Aug. 3, 2021, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

BACKGROUND

1. Field of the Disclosure

The disclosure relates to the field of power electronic devices, and particularly to a method and device for monitoring partial discharge.

2. Related Art

In recent years, power electronics have developed towards high frequencies, high voltages and high power densities. The risk of insulation failure is increasing due to the increased power densities and the ageing of the insulation equipment that is subjected to long working voltages. Once insulation failure occurs, the insulating devices will necessarily cause a major accident, resulting in losses of life and property. The insulation state of the insulating devices must be monitored.

Due to the development of partial discharges and the fact that the intensity of the discharges can sensitively reflect the damaged state of the insulation, partial discharge monitoring has become an important means for monitoring the insulation state.

In actual partial discharge monitoring site, there are various sources of interference and affect the partial discharge monitoring through radiation or conduction. As for interference of radiation, influence on partial discharge monitoring can be eliminated through reasonable shielding measures, but since a ground wire of the partial discharge monitoring device and a ground wire of other power electronic devices are interconnected, the power electronic devices in operation easily produce conducted interference to affect the partial discharge monitoring device through the interconnected ground wires. In addition, because of the weak source of the partial discharge signal and the strong and broad spectrum of the interference signal conducted through the ground, the partial discharge signal can easily be drowned out by the interference signal.

A method known to the inventors is pulse current method. FIG. 1 is a schematic diagram of a pulse current method. As shown in FIG. 1, in a partial discharge monitoring circuit, a coupling impedance 101 is connected in parallel to both ends of a tested product 103 after connected in series to a sensor 102, and a high voltage excitation 104 (a high voltage to ground) is applied to both ends of the tested product 103. When the tested product 103 has partial discharge, a partial discharge signal 105 flows in a testing loop consisting of the coupling impedance 101 and the tested product 103, the partial discharge signal 105 is sampled by the sensor 102, and an insulation state of the current tested product 103 is judged according to the sampled partial discharge signal 105.

SUMMARY

The disclosure provides a method and device for monitoring partial discharge, which can avoid the partial discharge monitoring device from wrongly determining an interference signal to be a partial discharge signal, enhance anti-interference capability of the partial discharge monitoring device, and improve monitoring accuracy.

The disclosure provides a method for monitoring partial discharge, comprising:
  step a, connecting a monitoring circuit in parallel to both ends of a tested product, disposing a ground wire between the monitoring circuit and ground, disposing a first sensor in the monitoring circuit, and disposing a ground wire sensor on the ground wire;
  step b, applying an excitation signal to the tested product, acquiring a first signal through the first sensor, and acquiring a ground wire signal through the ground wire sensor within a monitoring cycle; and
  step c, determining whether the tested product has partial discharge through the first signal and the ground wire signal.

The disclosure further provides a device for monitoring partial discharge, which is applied to a tested product, comprising:
  a monitoring circuit connected in parallel to both ends of the tested product, and a ground wire disposed between the monitoring circuit and ground;
  a first sensor connected in series to the monitoring circuit;
  a ground wire sensor connected in series to the ground wire;
  an excitation source for applying an excitation signal to the tested product; and
  a signal detection processing unit for acquiring a first signal from the first sensor and acquiring a ground wire signal from the ground wire sensor within a monitoring cycle, and determining whether the tested product has partial discharge through the first signal and the ground wire signal.

By logically determining output signals of the ground wire sensor and the first sensor, the disclosure avoids wrongly determining the interference signal to be the partial discharge signal, enhances anti-interference capability of the partial discharge monitoring device, and improves accuracy of partial discharge monitoring.

Hereinafter the disclosure is described in details with reference to the accompanying drawings and the detailed embodiments, but the disclosure is not limited thereto.

DETAILED EMBODIMENTS OF THE INVENTION

Hereinafter the technical solution of the disclosure is described in details with reference to the accompanying drawings and the detailed embodiments to further understand objects, solutions, and effects of the disclosure, instead of limiting the scope protected by the appended claims of the disclosure.

Figure 1:
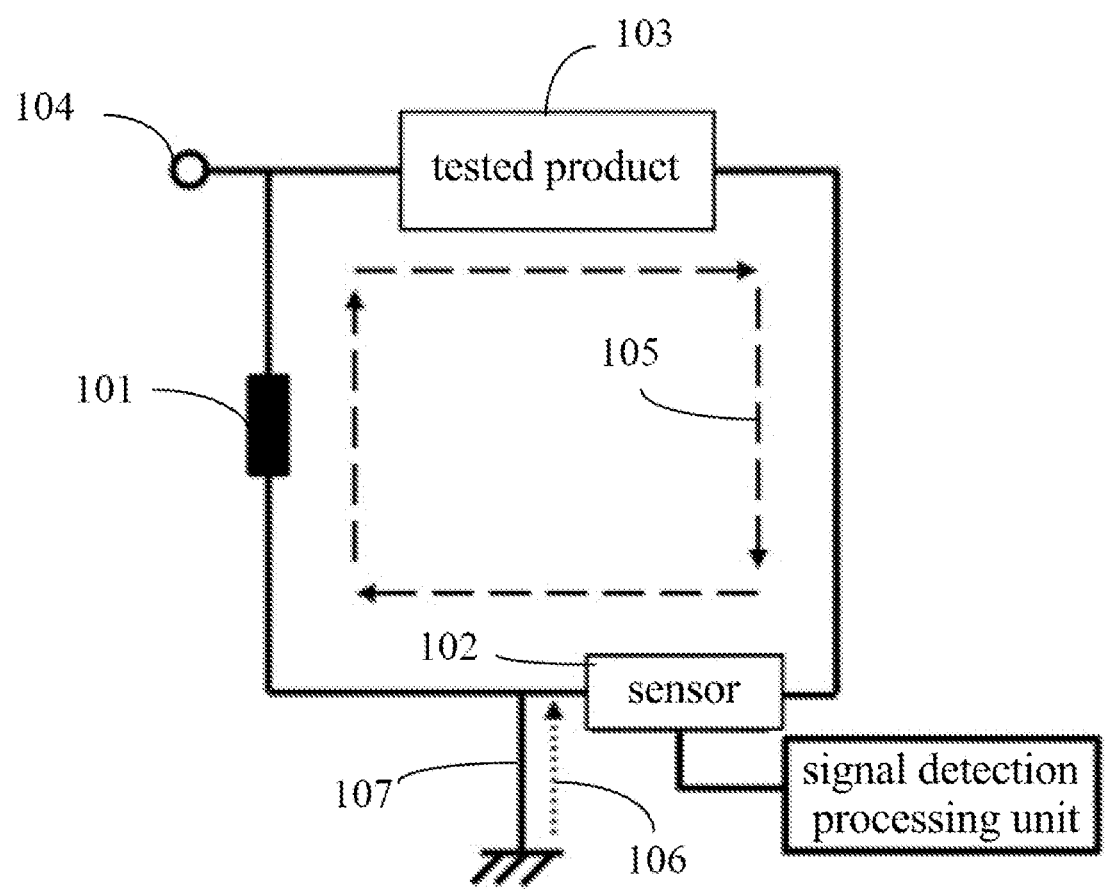
FIG. 1 is a schematic diagram of a pulse current method in the prior art.
Figure 2:
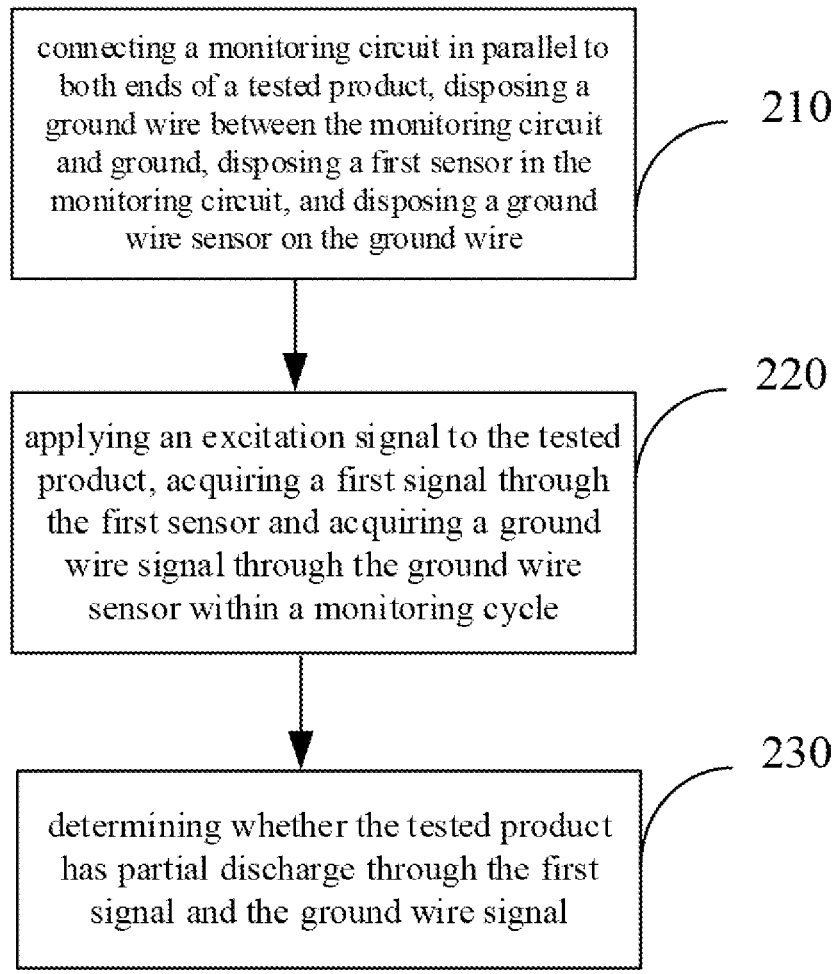
FIG. 2 is a flow diagram of steps of a method for monitoring partial discharge in one embodiment of the disclosure.
Figure 3:
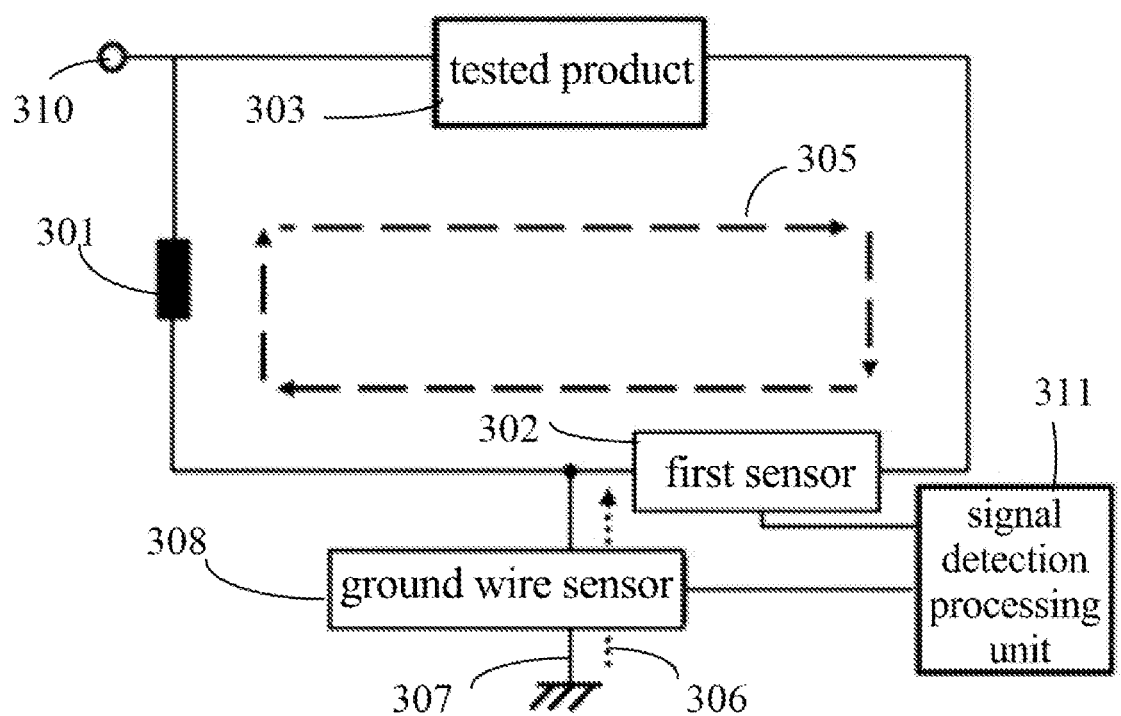
FIG. 3 is a schematic diagram of a device for monitoring partial discharge in one embodiment of the disclosure.

FIG. 2 and FIG. 3 are a flow chart and a schematic diagram of a method for monitoring partial discharge provided in one of the embodiments of the disclosure. Referring to FIGS. 2 and 3, the disclosure provides a method for monitoring partial discharge, comprising:

step 210, connecting a monitoring circuit in parallel to both ends of a tested product, disposing a ground wire between the monitoring circuit and ground, disposing a first sensor in the monitoring circuit, and disposing a ground wire sensor on the ground wire;

step 220, applying an excitation signal to the tested product, acquiring a first signal through the first sensor and acquiring a ground wire signal through the ground wire sensor within a monitoring cycle; and step 230, determining whether the tested product has partial discharge through the first signal and the ground wire signal.

By providing the ground wire sensor on the ground wire, when an interference signal is generated by a grounded interference source around the monitoring device, the interference signal flows through both the ground wire sensor and the first sensor in the partial discharge monitoring circuit. The embodiments of the present disclosure avoids misjudging the interference signal as a partial discharge signal by logically determining the output signals of the ground wire sensor and the first sensor within the same monitoring cycle, thus improving the anti-interference capability of the partial discharge monitoring device and improving the accuracy of the partial discharge monitoring.

Figure 4:
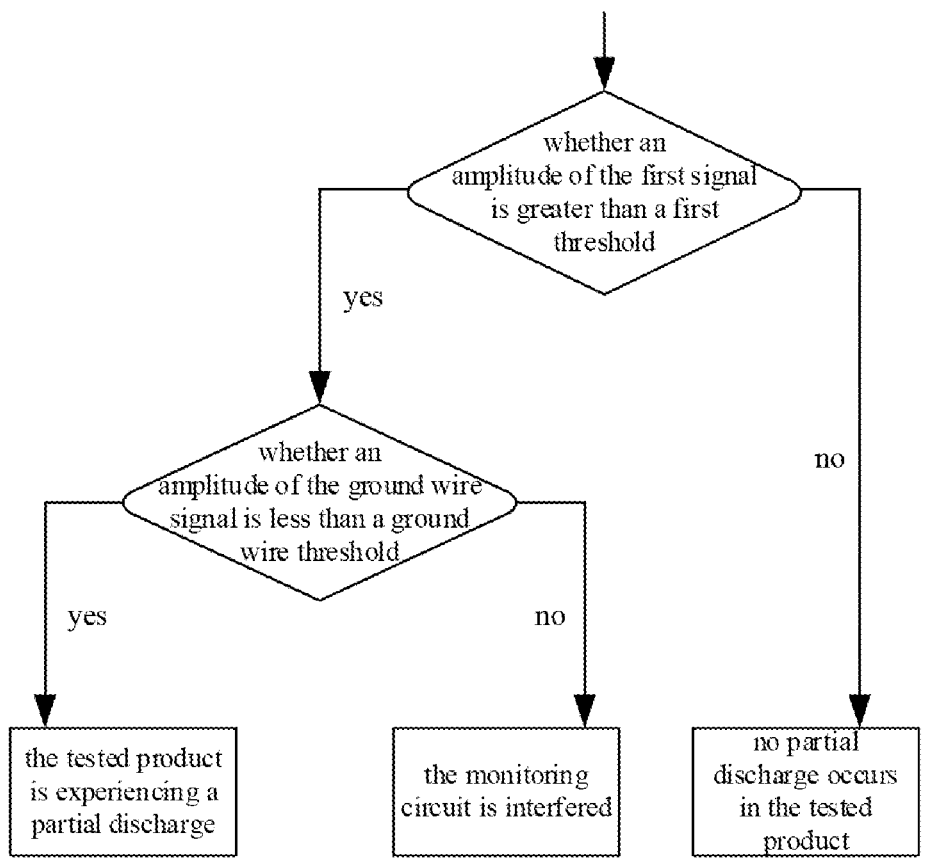
FIG. 4 is a logic diagram of determining whether partial discharge occurs according to a first signal and a ground wire signal in one embodiment of the disclosure.

FIG. 4 is a logic diagram of one of the embodiments of the disclosure for determining whether partial discharge occurs according to the first signal and the ground wire signal. Referring to FIGS. 3 and 4, in another embodiments of the disclosure, the step 230 further comprises:

if an amplitude of the first signal 305 is greater than a first threshold, and an amplitude of the ground wire signal 306 is less than a ground wire threshold, determining that the tested product 303 is experiencing a partial discharge;

if an amplitude of the first signal 305 is greater than the first threshold, and an amplitude of the ground wire signal 306 is greater than the ground wire threshold, determining that the monitoring circuit is interfered;

if an amplitude of the first signal 305 is less than or equal to the first threshold, determining that no partial discharge occurs in the tested product 303.

The first threshold and the ground wire threshold are preset values according to the application environments, or values obtained from the calibration by a calibration device. The first threshold and the ground wire threshold are not equal, but the disclosure is not limited thereto.

As can be seen, the first signal confirms that a strong signal (e.g., a current) is flowing in the monitoring circuit, and the ground wire signal determines whether the strong signal is an interference, thereby eliminating the interferences transmitted through the ground wire and allowing a precise determination of whether a real partial discharge is occurring.

Figure 9A:
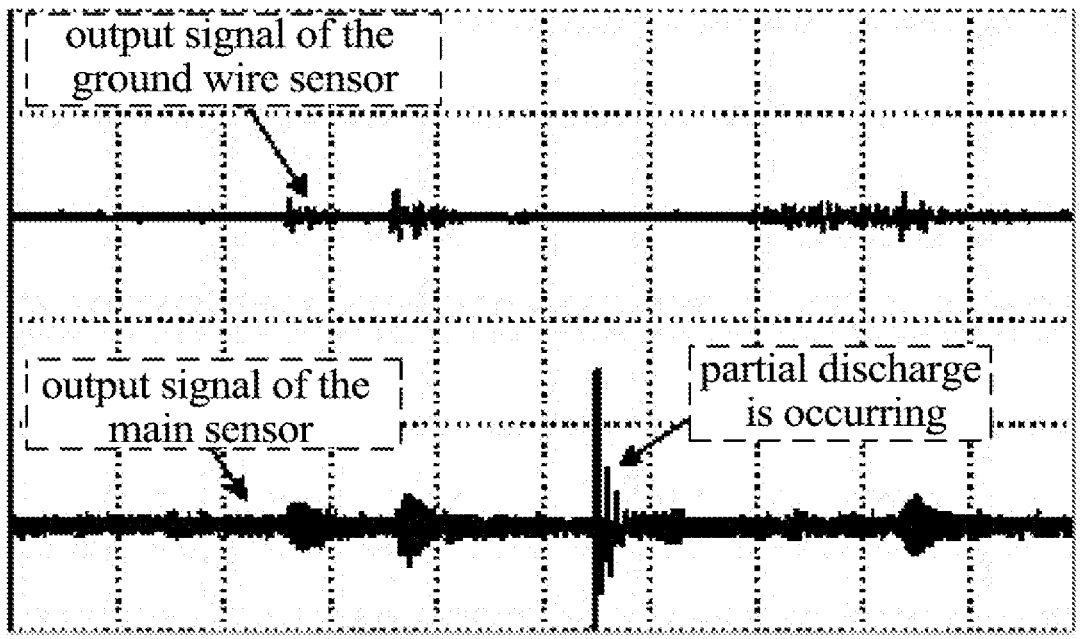
FIG. 9a is a graph of signals sampled by a sensor when partial discharge occurs under an actual measurement environment in one embodiment of the disclosure.
Figure 9B:
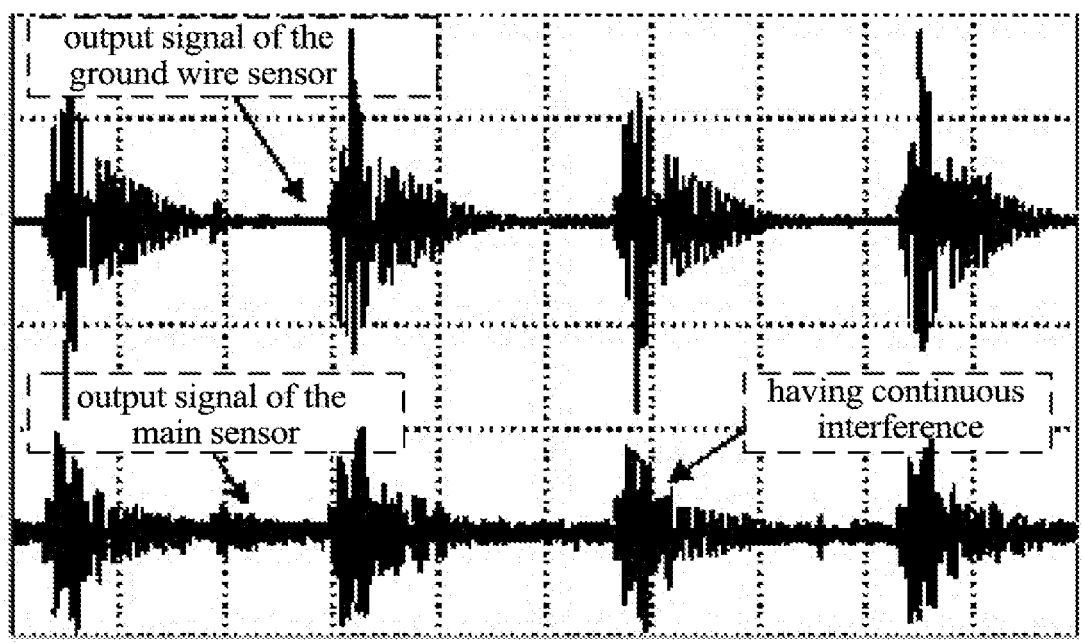
FIG. 9b is a graph of signals sampled by a sensor when interference occurs under an actual measurement environment in one embodiment of the disclosure.

FIG. 9a provides a plot of signals sampled by a sensor when partial discharge occurs under actual measurement environment. As shown in FIG. 9a, the output signal (a ground wire signal) of the ground wire sensor is small and significantly smaller than the ground wire threshold in a monitoring cycle, indicating that there is no interference occurs, while the output signal (a first signal) of the main sensor (the first sensor) is large, and significantly greater than the first threshold, indicating that a partial discharge is occurring. FIG. 9b provides a plot of signals sampled by a sensor when interference occurs under actual measurement environment. As shown in FIG. 9b, the output signal (the ground wire signal) of the ground wire sensor is large and significantly greater than the ground wire threshold in one monitoring cycle, indicating that there exists interferences. Although the output signal (the first signal) of the main sensor (the first sensor) is also larger than the first threshold, it is in all probability caused by the interference signal, so it is judged as having interference instead of partial discharge.

Figure 5:
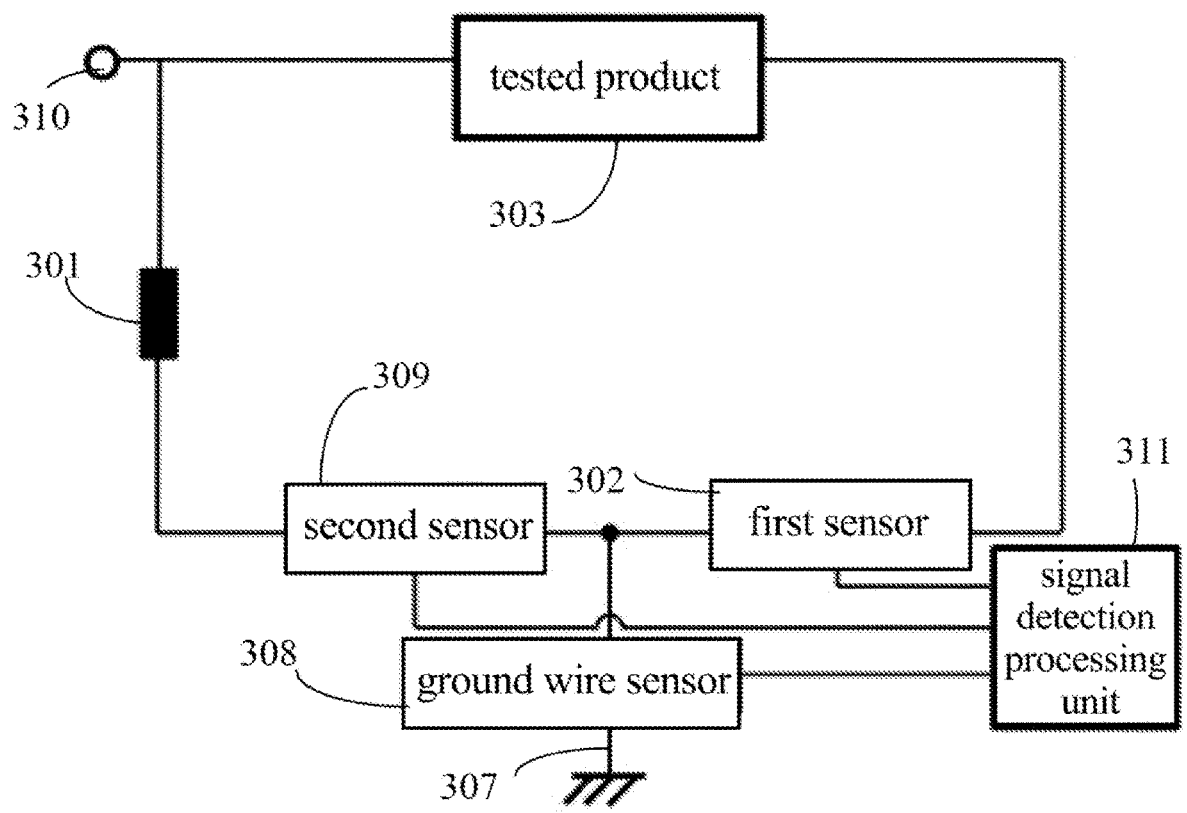
FIG. 5 is a schematic diagram of a device for monitoring partial discharge in another embodiment of the disclosure.

FIG. 5 is a schematic diagram of a device for monitoring partial discharge in another embodiment of the present disclosure. Referring to FIGS. 2 and 5, the step 210 further comprises: disposing a second sensor 309 in the monitoring circuit;

the step 220 further comprises: acquiring a second signal through the second sensor 309;

the step 230 further comprises: determining whether the tested product 303 has partial discharge through the first signal, the second signal and the ground wire signal.

Figure 6:
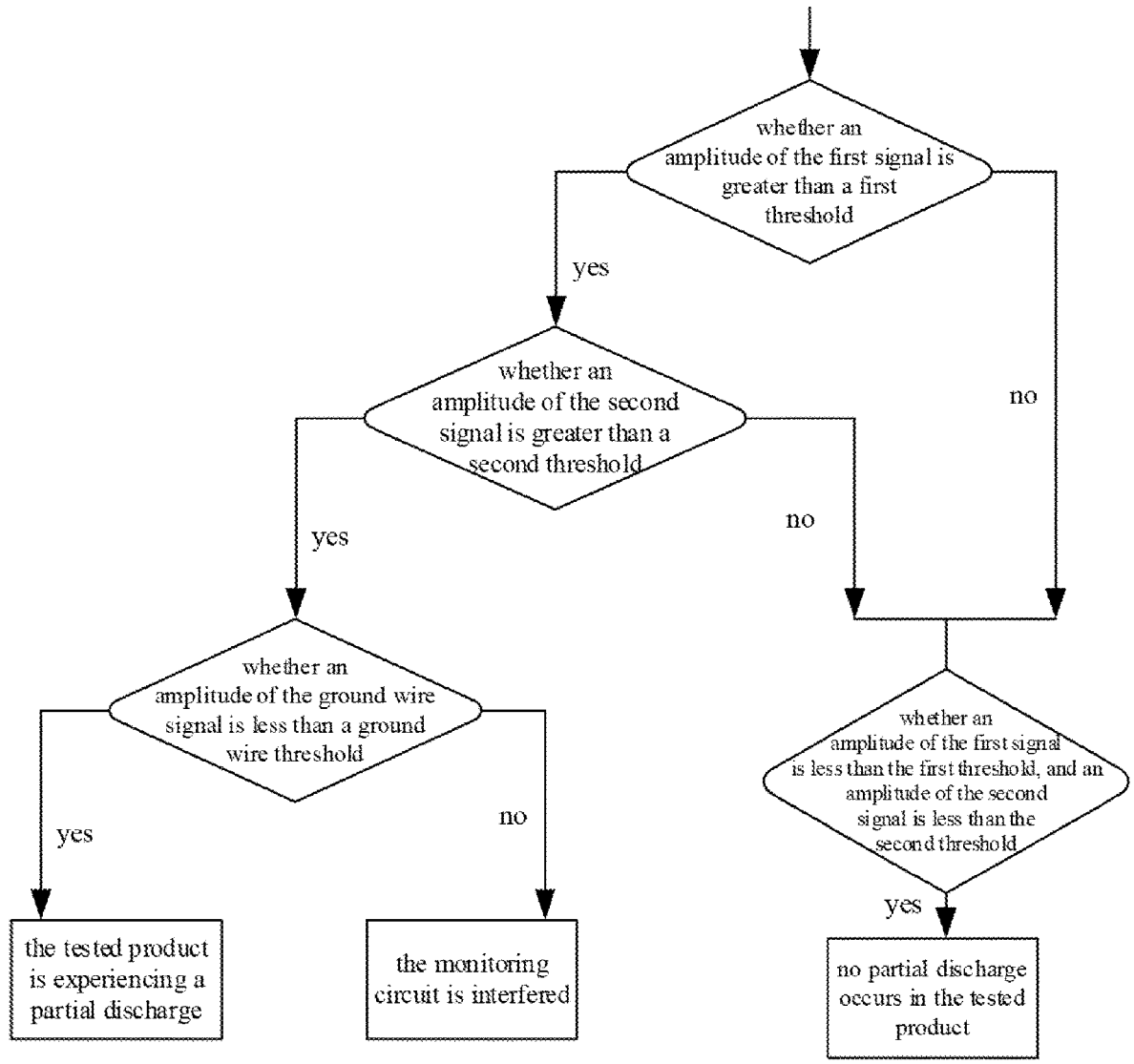
FIG. 6 is a logic diagram of determining whether partial discharge occurs according to a first signal, a second signal and a ground wire signal in one embodiment of the disclosure.

FIG. 6 is a logic diagram of another embodiments of the disclosure for determining whether partial discharge occurs according to a first signal, a second signal and a ground wire signal. Referring to FIGS. 5 and 6, the step 230 of the monitoring method further comprises:

if an amplitude of the first signal is greater than a first threshold, an amplitude of the second signal is greater than a second threshold, and an amplitude of the ground wire signal is less than a ground wire threshold, determining that the tested product is experiencing a partial discharge;

if an amplitude of the first signal is greater than the first threshold, an amplitude of the second signal is greater than the second threshold, and an amplitude of the ground wire signal is greater than the ground wire threshold, determining that the monitoring circuit is interfered;

if an amplitude of the first signal is less than the first threshold, and an amplitude of the second signal is less than the second threshold, determining that no partial discharge occurs in the tested product.

As can be seen, the first signal and the second signal provide a more accurate confirmation (double confirmation) confirm that a strong signal is flowing through the monitoring circuit, and the ground wire signal is used to determine whether the strong signal is an interference, thus allowing a more accurate determination of whether a real partial discharge is occurring in the tested product.

As shown in FIG. 3, the disclosure further provides one of the embodiments of a device for monitoring partial discharge. The device for monitoring partial discharge is configured to monitor a tested product 303 for partial discharge, in which a monitoring circuit is connected in parallel to both ends of the tested product 303, and a ground wire 307 is disposed between the monitoring circuit and ground; a first sensor 302 is connected in series with the monitoring circuit; a ground wire sensor 308 is connected in series with the ground wire 307; an excitation source 310 electrically connected to one end of the tested product 303 for applying an excitation, such as, an excitation voltage, to the tested product 303; and a signal detection processing unit 311 coupled to the first sensor and the ground wire sensor. The signal detection processing unit 311 is configured to acquire a first signal 305 from the first sensor 302 and acquire a ground wire signal 306 from the ground wire sensor 308 within a monitoring cycle and to determine whether a partial discharge occurs in the tested product 303 based on the first signal 305 and the ground wire signal 306.

Please continue to refer to FIG. 3, in one embodiment of the disclosure, the monitoring circuit further comprises a coupling impedance 301 connected in series to the first sensor 302, and the coupling impedance 301 has one end electrically connected to one end of the tested product and the excitation source 310 together, and the other end electrically connected to a connection node (i.e., a ground point) between the monitoring circuit and the ground wire 307. In this embodiment, the first sensor 302 and the coupling impedance 301 are disposed on both sides of the ground point. In other embodiments, the first sensor also can be disposed at other positions of the monitoring circuit, for example, the first sensor 302 and the coupling impedance 301 are together disposed on the same side of the ground wire, i.e., the first sensor 302 is connected in series between one end of the coupling impedance 301 and the ground point.

Figure 7:
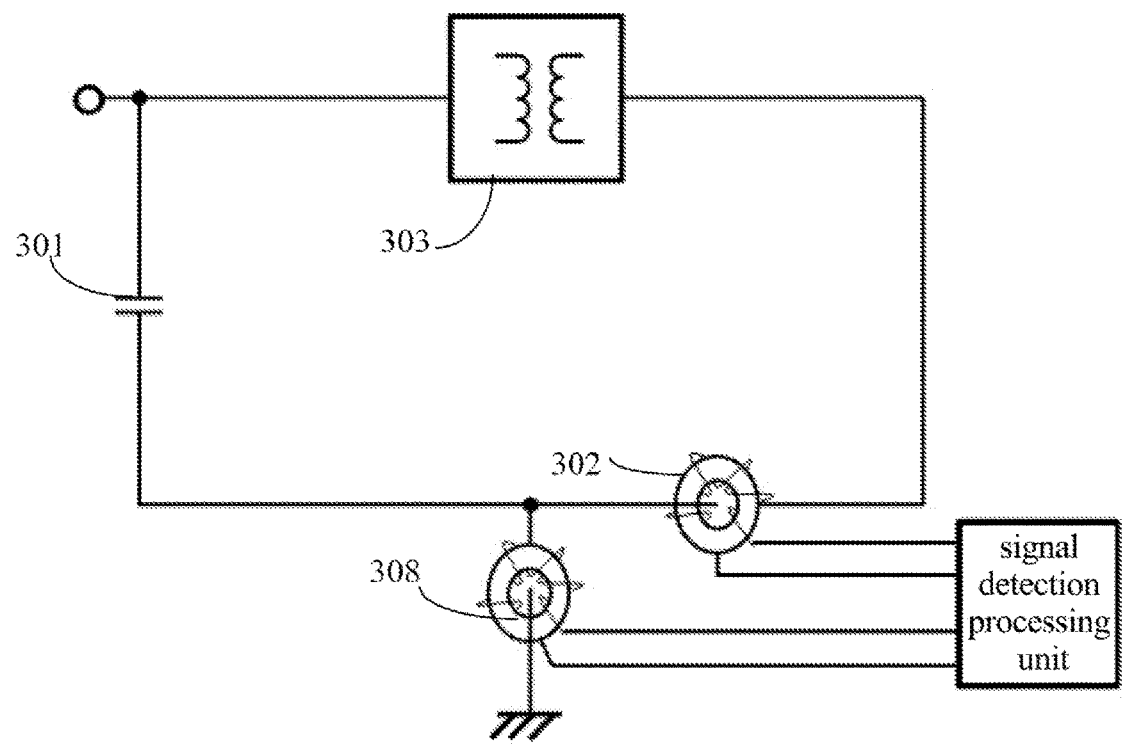
FIG. 7 is a schematic diagram of a device for monitoring partial discharge in still another embodiment of the disclosure.

As shown in FIG. 7, in one embodiment of the disclosure, the coupling impedance 301 can be a capacitor, and requirement for the capacitor is to ensure that the capacitor does not have partial discharge when the excitation signal is applied to both ends of the tested product 303. The tested product 303 also can be a transformer, and in other embodiments, the tested product 303 also can be a device having insulation requirements such as a current Hall or high-voltage capacitor, but the disclosure is not limited thereto. In the disclosure, the first sensor 302 and the ground wire sensor 308 can be current sensors. Similarly, in the embodiment of FIG. 5, a second sensor 309 also can be a current sensor.

Figure 8:
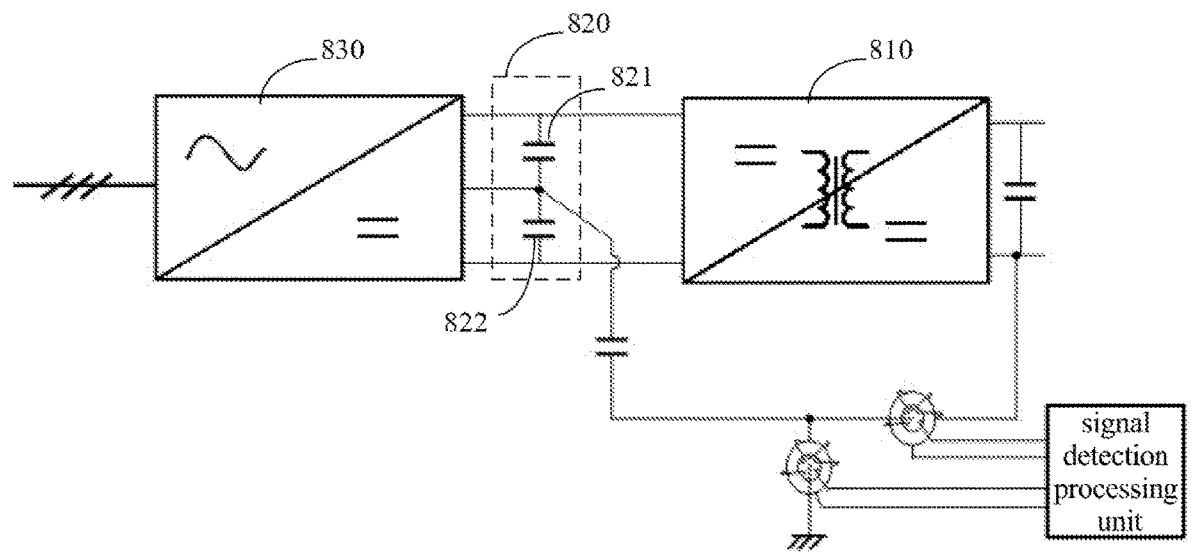
FIG. 8 is a schematic diagram of a device for monitoring partial discharge in even another embodiment of the disclosure.

As shown in FIG. 8, in another embodiment of the disclosure, the tested product 303 also can be an isolated converter, and the monitoring circuit has one end electrically connected to an input end of the isolated converter, and the other end electrically connected to an output end of the isolated converter.

In this embodiment, the isolated converter 810 comprises a bus capacitor 820. One end of the bus capacitor 820 is connected in parallel to the input end, another end of the bus capacitor 820 is connected to the one end of the monitoring circuit, such as electrically connected to a positive electrode or a negative electrode of the bus capacitor. In other embodiments, when the bus capacitor comprises a plurality of capacitors connected in series, one end of the monitoring circuit also can be electrically connected to a connection node between two adjacent capacitors. For example, when only a first capacitor 821 and a second capacitor 822 are connected in series, one end of the monitoring circuit is electrically connected to a series connection node between the first capacitor 821 and the second capacitor 822. Moreover, in this embodiment, the input end of the isolated converter 810 is electrically connected to an output end of a pre-stage conversion circuit 830 through the bus capacitor 820, and the pre-stage conversion circuit 830 can be configured to provide an excitation voltage to the isolated converter.

Referring to FIG. 5, in another embodiment of the disclosure, the monitoring circuit further comprises a second sensor 309, and the coupling impedance 301, the second sensor 309 and the first sensor 302 are sequentially connected in series. Moreover, the signal detection processing unit 311 is also connected to the second sensor 309 for receiving a second signal acquired by the second sensor 309, and determining whether the tested product 303 has partial discharged according to the first signal, the second signal and the ground wire signal within the same monitoring cycle.

In one embodiment, the second sensor 309 and the first sensor 302 can be disposed on both sides of a connection node (a ground point) between the ground wire 307 and the monitoring circuit, respectively.

Of course, in other embodiments, the second sensor 309 and the first sensor 302 also can be disposed on the same side of the ground point, but the disclosure is not limited thereto.

Referring to FIGS. 3 and 4, in one embodiment of the disclosure, the signal detection processing unit 311 has the following determining logic:

within one monitoring cycle, if an amplitude of the first signal is greater than a first threshold, and an amplitude of the ground wire signal is less than a ground wire threshold, determining that the tested product is experiencing a partial discharge;

if an amplitude of the first signal is greater than the first threshold, and an amplitude of the ground wire signal is greater than the ground wire threshold, determining that the monitoring circuit is interfered;

if an amplitude of the first signal is less than the first threshold, determining that no partial discharge occurs in the tested product Referring to FIGS. 5 and 6, in one embodiment of the disclosure, the signal detection processing unit 311 is further configured to acquire a second signal from the second sensor 309, and the signal detection processing unit 311 has the following determining logic:

within one monitoring cycle, if an amplitude of the first signal is greater than a first threshold, an amplitude of the second signal is greater than a second threshold, and an amplitude of the ground wire signal is less than a ground wire threshold, determining that the tested product is experiencing a partial discharge;

if an amplitude of the first signal is greater than the first threshold, an amplitude of the second signal is greater than the second threshold, and an amplitude of the ground wire signal is greater than the ground wire threshold, determining that the monitoring circuit is interfered;

if an amplitude of the first signal is less than the first threshold, and an amplitude of the second signal is less than the second threshold, determining that no partial discharge occurs in the tested product.

The first threshold, the second threshold and the ground wire threshold can be preset values according to actual situations, the first threshold can be equal to the second threshold, and the ground wire threshold can be different from the first threshold or the second threshold.

As can be seen, in the embodiment of the disclosure, the signal detection processing unit 311 determines flowing of a strong current in the monitoring device through the first signal and the second signal more accurately, and judges whether the strong current is interference through the ground wire signal, thereby determining whether the tested product has partial discharge more accurately.

Therefore, the present disclosure further has the following advantages:

1) the embodiments of the present disclosure allows the partial discharge monitoring to avoid misjudging the interference signal as the partial discharge signal in the presence of interference, and improve the anti-interference capability of the partial discharge monitoring device.

2) the partial discharge monitoring device of the embodiments of the present disclosure has few components, and is easily implemented at a low cost.

3) the embodiments of the present disclosure can be widely applied to partial discharge monitoring of various isolated converters and insulating devices.

Of course, the disclosure may further have various other embodiments, and those skilled in the art shall make various corresponding modifications and variations to the disclosure without departing from spirit and essence of the disclosure, but these corresponding modifications and variations shall belong to the scope protected by the appended claims of the disclosure.

What is claimed is:

1. A method for monitoring partial discharge, comprising:
   step a, connecting a monitoring circuit in parallel to both ends of a tested product, disposing a ground wire between the monitoring circuit and ground, disposing a first sensor in the monitoring circuit, and disposing a ground wire sensor on the ground wire;
   step b, applying an excitation to the tested product, acquiring a first signal through the first sensor, and acquiring a ground wire signal through the ground wire sensor within a monitoring cycle; and
   step c, determining whether the tested product has partial discharge through the first signal and the ground wire signal by means of a signal detection processing unit.

2. The method for monitoring partial discharge according to claim 1, wherein the monitoring circuit further comprises a coupling impedance connected in series to the first sensor.

3. The method for monitoring partial discharge according to claim 1, wherein the step c particularly comprises:
   if an amplitude of the first signal is greater than a first threshold, and an amplitude of the ground wire signal is less than a ground wire threshold, determining that the tested product is experiencing a partial discharge;
   if an amplitude of the first signal is greater than the first threshold, and an amplitude of the ground wire signal is greater than the ground wire threshold, determining that the monitoring circuit is interfered; and
   if an amplitude of the first signal is less than the first threshold, determining that no partial discharge occurs in the tested product.

4. The method for monitoring partial discharge according to claim 1, wherein
   the step a further comprises: disposing a second sensor in the monitoring circuit;
   the step b further comprises: acquiring a second signal through the second sensor;
   the step c particularly comprises: determining whether the tested product has partial discharge through the first signal, the second signal and the ground wire signal by means of the signal detection processing unit.

5. The method for monitoring partial discharge according to claim 4, wherein the step c particularly comprises:
   if an amplitude of the first signal is greater than a first threshold, an amplitude of the second signal is greater than a second threshold, and an amplitude of the ground wire signal is less than a ground wire threshold, determining that the tested product is experiencing a partial discharge;
   if an amplitude of the first signal is greater than the first threshold, an amplitude of the second signal is greater than the second threshold, and an amplitude of the ground wire signal is greater than the ground wire threshold, determining that the monitoring circuit is interfered; and
   if an amplitude of the first signal is less than the first threshold, and an amplitude of the second signal is less than the second threshold, determining that no partial discharge occurs in the tested product.

6. The method for monitoring partial discharge according to claim 4, wherein
   the second sensor and the first sensor are disposed on both sides of a connection node between the ground wire and the monitoring circuit, respectively.

7. A device for monitoring partial discharge, which is applied to a tested product, comprising:
   a monitoring circuit connected in parallel to both ends of the tested product, and a ground wire disposed between the monitoring circuit and ground;
   a first sensor connected in series to the monitoring circuit;
   a ground wire sensor connected in series to the ground wire;
   an excitation source for applying an excitation to the tested product; and
   a signal detection processing unit for acquiring a first signal from the first sensor and acquiring a ground wire signal from the ground wire sensor within a monitoring cycle, and determining whether the tested product has partial discharge through the first signal and the ground wire signal.

8. The device for monitoring partial discharge according to claim 7, wherein the monitoring circuit further comprises a coupling impedance connected in series to the first sensor.

9. The device for monitoring partial discharge according to claim 8, wherein the tested product is a transformer.

10. The device for monitoring partial discharge according to claim 8, wherein the tested product is an isolated converter, and the monitoring circuit has one end electrically connected to an input end of the isolated converter, and the other end electrically connected to an output end of the isolated converter.

11. The device for monitoring partial discharge according to claim 10, wherein the isolated converter comprises a bus capacitor connected in parallel to the input end, and one end of the monitoring circuit is electrically connected to the bus capacitor.

12. The device for monitoring partial discharge according to claim 11, wherein the bus capacitor comprises a first capacitor and a second capacitor connected in series, and one end of the monitoring circuit is electrically connected to a connection node between the first capacitor and the second capacitor.

13. The device for monitoring partial discharge according to claim 8, wherein the monitoring circuit further comprises a second sensor, and the coupling impedance, the second sensor and the first sensor are sequentially connected in series.

14. The device for monitoring partial discharge according to claim 13, wherein
the second sensor and the first sensor are disposed on both sides of a connection node between the ground wire and the monitoring circuit, respectively; or
the second sensor and the first sensor are disposed on the same side of a connection node between the ground wire and the monitoring circuit.

15. The device for monitoring partial discharge according to claim 13, wherein the signal detection processing unit is further configured to acquire a second signal from the second sensor, and the signal detection processing unit has the following determining logic:
if an amplitude of the first signal is greater than a first threshold, an amplitude of the second signal is greater than a second threshold, and an amplitude of the ground wire signal is less than a ground wire threshold, determining that the tested product is experiencing a partial discharge;
if an amplitude of the first signal is greater than the first threshold, an amplitude of the second signal is greater than the second threshold, and an amplitude of the ground wire signal is greater than the ground wire threshold, determining that the monitoring circuit is interfered;
if an amplitude of the first signal is less than the first threshold, and an amplitude of the second signal is less than the second threshold, determining that no partial discharge occurs in the tested product.

16. The device for monitoring partial discharge according to claim 8, wherein the signal detection processing unit has the following determining logic:
if an amplitude of the first signal is greater than a first threshold, and an amplitude of the ground wire signal is less than a ground wire threshold, determining that the tested product is experiencing a partial discharge;
if an amplitude of the first signal is greater than the first threshold, and an amplitude of the ground wire signal is greater than the ground wire threshold, determining that the monitoring circuit has interfered;
if an amplitude of the first signal is less than the first threshold, determining that no partial discharge occurs in the tested product.

17. The device for monitoring partial discharge according to claim 8, wherein the coupling impedance is a capacitor.

18. The device for monitoring partial discharge according to claim 7, wherein the first sensor and the ground wire sensor are current sensors.

* * * * *